United States Patent
Li et al.

(10) Patent No.: US 8,890,601 B2
(45) Date of Patent: Nov. 18, 2014

(54) METHOD, SYSTEM, AND CIRCUIT WITH A DRIVER OUTPUT INTERFACE HAVING A COMMON MODE CONNECTION COUPLED TO A TRANSISTOR BULK CONNECTION

(75) Inventors: Miao Li, San Diego, CA (US); Xiaohua Kong, San Diego, CA (US); Nam V. Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/294,928

(22) Filed: Nov. 11, 2011

(65) Prior Publication Data

US 2013/0120028 A1    May 16, 2013

(51) Int. Cl.
| H03B 1/00 | (2006.01) |
| H03F 3/24 | (2006.01) |
| H03F 3/45 | (2006.01) |
| H03F 1/22 | (2006.01) |
| H03F 3/195 | (2006.01) |

(52) U.S. Cl.
CPC .............. *H03F 1/223* (2013.01); *H03F 3/245* (2013.01); *H03F 2203/45418* (2013.01); *H03F 3/45085* (2013.01); *H03F 3/45659* (2013.01); *H03F 2203/45696* (2013.01); *H03F 2203/45702* (2013.01); *H03F 2203/45726* (2013.01); *H03F 3/195* (2013.01)
USPC ........... 327/534; 327/535; 327/378; 327/108; 326/30; 333/17.3

(58) Field of Classification Search
USPC ......... 327/108, 534, 535, 537, 103, 378, 379, 327/427, 434; 326/30, 62, 63, 68, 83; 367/152; 343/852; 340/538.14, 12.36; 333/17.3, 32, 124; 379/394, 398, 412; 324/756.06
See application file for complete search history.

(56) References Cited

U.S. PATENT DOCUMENTS

| 5,017,811 A | * | 5/1991 | Worley ........................... 326/71 |
| 5,689,209 A | * | 11/1997 | Williams et al. ............... 327/425 |
| 5,942,940 A | * | 8/1999 | Dreps et al. .................... 330/253 |

(Continued)

FOREIGN PATENT DOCUMENTS

EP    0938187 A1    8/1999

OTHER PUBLICATIONS

International Search Report and Written Opinion—PCT/US2012/064732—ISA/EPO—Jul. 2, 2013.

(Continued)

*Primary Examiner* — Lincoln Donovan
*Assistant Examiner* — Jung H Kim
(74) *Attorney, Agent, or Firm* — Donald D. Min

(57) ABSTRACT

A multi-terminal output with a common mode connection includes an output having a first terminal and a second terminal and having a common mode connection between the first terminal and the second terminal. A bulk connection of a transistor is coupled to the common mode connection. A first set of control signals and a second set of control signals are generated. Each of the first set of control signals has a first rail voltage level associated with a first power domain. The second set of control signals is generated from the first set of control signals. Each of the second set of control signals has a second rail voltage level that is associated with a second power domain. The second power domain is associated with a common mode voltage of outputs of an output driver.

35 Claims, 8 Drawing Sheets

(56) References Cited

U.S. PATENT DOCUMENTS

| | | | |
|---|---|---|---|
| 5,946,243 A * | 8/1999 | Sim | 365/189.11 |
| 5,988,819 A * | 11/1999 | Shieh et al. | 327/537 |
| 6,087,821 A | 7/2000 | Kojima | |
| 6,297,664 B1 * | 10/2001 | Galli | 326/30 |
| 6,335,653 B1 * | 1/2002 | Shigehara et al. | 327/534 |
| 6,377,112 B1 * | 4/2002 | Rozsypal | 327/534 |
| 6,462,611 B2 * | 10/2002 | Shigehara et al. | 327/534 |
| 6,586,964 B1 | 7/2003 | Kent et al. | |
| 6,909,305 B1 | 6/2005 | Li et al. | |
| 7,064,576 B1 * | 6/2006 | Maangat | 326/30 |
| 7,227,382 B1 | 6/2007 | Talbot et al. | |
| 7,595,656 B2 | 9/2009 | Hayami et al. | |
| 7,696,775 B2 | 4/2010 | Jian et al. | |
| 7,795,919 B2 * | 9/2010 | Fujiwara | 326/87 |
| 2009/0243707 A1 * | 10/2009 | Ito | 327/537 |
| 2010/0123521 A1 | 5/2010 | Bach | |
| 2010/0225382 A1 * | 9/2010 | Ito | 327/535 |
| 2011/0057727 A1 * | 3/2011 | Cranford et al. | 330/253 |
| 2011/0193595 A1 * | 8/2011 | Fukuda et al. | 327/108 |
| 2012/0265943 A1 * | 10/2012 | Koob et al. | 711/144 |

OTHER PUBLICATIONS

Partial International Search Report—PCT/US2012/064732—ISA/EPO—Feb. 20, 2013.

* cited by examiner

METHOD, SYSTEM, AND CIRCUIT WITH A DRIVER OUTPUT INTERFACE HAVING A COMMON MODE CONNECTION COUPLED TO A TRANSISTOR BULK CONNECTION

I. FIELD

The present disclosure is generally related to adjusting output impedance of a driver.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Such computing devices may include a data or clock transmitter that uses various types of components, such as an open-drain output driver. An open-drain output driver may be used in some applications that require high speed operations. For example, open-drain output drivers can be used in High-Definition Multimedia Interface (HDMI) compliant transmitters for both clock and data outputs. However, impedance mismatch between an output driver and a transmission line coupled to the output driver can impact performance of the transmitter. For example, impedance mismatch may result in lost transmission power due to reflection loss.

III. SUMMARY

An output interface with a common mode connection coupled to a transistor bulk connection is disclosed. The output interface may be an output of an open drain driver that provides differential signaling, such as an HDMI driver. The driver may include a resistor network that is controllable to reduce an impedance mismatch between the driver output and transmission lines that may be coupled to the driver output. The resistor network is controlled by transistors, and a bulk connection of the transistors is coupled to the common mode connection of the output interface. When the output interface is coupled to a receiver side that operates at a higher voltage than the output interface, a reliability of the transistors may be maintained because of the coupling of the bulk connection of the transistors to the common mode connection of the output interface. In a particular implementation, when an open drain driver is coupled to a receiver side that operates at a higher voltage than a driver side supply voltage, a common mode voltage of the driver output may be utilized to maintain a reliability of one or more driver side transistors. For example, by coupling the common mode voltage to a bulk connection of a transistor used in adjusting output impedance of the open drain driver, the output impedance of the open drain driver may be adjusted without reducing the reliability of the transistors.

In a particular embodiment, a circuit includes an output having a first terminal and a second terminal and having a common mode connection between the first terminal and the second terminal. The circuit also includes at least one transistor having a bulk connection. The bulk connection is coupled to the common mode connection.

In another particular embodiment, an apparatus includes a resistor network including at least one resistor and the apparatus includes a first set of transistors and a second set of transistors. The first set of transistors is powered by a first power domain. The second set of transistors is responsive to the first set of transistors. The second set of transistors is level shifted to a second power domain and controls the resistor network.

In a particular embodiment, a method includes generating a first set of control signals. Each of the first set of control signals has a first rail voltage level associated with a first power domain. The method also includes generating a second set of control signals from the first set of control signals. Each of the second set of control signals has a second rail voltage level that is associated with a second power domain. The second power domain is associated with a common mode voltage of outputs of an output driver.

One particular advantage provided by at least one of the disclosed embodiments is that output impedance may be adjusted for an open-drain output driver that operates at a lower supply voltage than a receiver that is coupled to the open-drain output driver. Adjusting the output impedance of the open-drain driver may enable reduction of impedance mismatch and improve quality of signal transmission.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
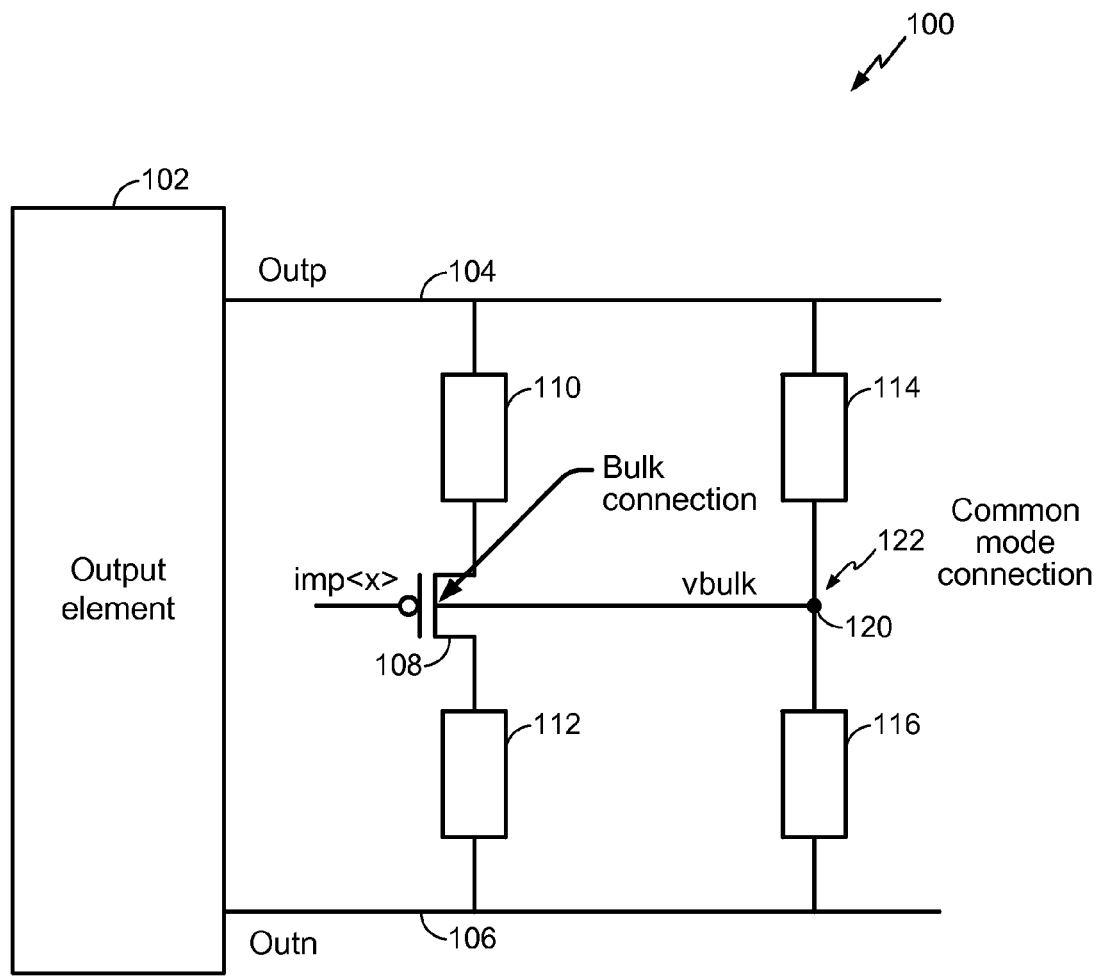
FIG. 1 is a block diagram of a particular illustrative embodiment of a multi-terminal output with a common mode connection.

Referring to FIG. 1, a particular illustrative embodiment of a multi-terminal output with a common mode connection is depicted and generally designated 100. The multi-terminal output with a common mode connection 100 is a circuit that includes an output element 102 having a first terminal 104 and a second terminal 106. A transistor 108 is coupled to the first terminal 104 via a first resistive element 110. A second resistive element 112 is coupled to the transistor 108 and to the second terminal 106. A third resistive element 114 is coupled to the first terminal 104 and is coupled to a fourth resistive element 116 via a node 120. The fourth resistive element 116 is coupled to the second terminal 106. The node 120 represents a common mode connection 122 of the first terminal 104 and the second terminal 106. The node 120 is coupled to a bulk connection of the transistor 108. Coupling of the bulk connection of the transistor 108 to the node 120 allows the transistor 108 to accommodate a large gate bias at the gate of the transistor 108. A bulk bias (vbulk) at node 120 may be a common mode voltage of the first terminal 104 and the second terminal 106.

In a particular embodiment, the output element 102 may be coupled to a driver, may be part of a driver, or may be an output driver inside a transmitter, such as a high-definition multimedia interface (HDMI) compliant transmitter. For example, the output element 102 may apply a differential signal at the first terminal 104 and the second terminal 106. The first terminal 104 may be coupled to a drain terminal of a transistor that is inside the output element 102 and the second terminal 106 may be coupled to a drain terminal of another transistor that is inside the output element 102, as described with respect to FIG. 2. The output element 102 may be coupled to a receiver side (not shown) via transmission lines as described in further detail with respect to FIG. 2. The output element 102 may be configured to operate at a supply voltage that is lower than a supply voltage used at the receiver side. In a particular non-limiting example, the output element 102 may operate at a supply voltage of approximately 1.8 volts while coupled to a receiver side that operates at 3.3 volts.

In a particular embodiment, the first resistive element 110 and the second resistive element 112 may be resistors. The first resistive element 110, the transistor 108, and the second resistive element 112 may be components in a resistor network, alternatively referred to as a resistive network herein. The resistor network is controlled to adjust the output impedance of the multi-terminal output with a common mode connection 100.

In a particular embodiment, the third resistive element 114 may represent one or more resistors, and the fourth resistive element 116 may represent one or more resistors. The node 120 between third resistive element 114 and the fourth resistive element 116 represents the common mode connection 122 of the first terminal 104 and the second terminal 106.

As illustrated, the transistor 108 is coupled to the first resistive element 110 and the second resistive element 112. The transistor 108 is configured to receive an impedance control signal imp<x> at a gate of the transistor 108. The impedance control signal imp<x> may be level shifted to a power domain that is based on a supply voltage used by the receiver side. In a particular embodiment, the transistor 108 may be a transistor inside a transmitter, such as a high-definition multimedia interface (HDMI) compliant transmitter.

The transistor 108 may be fabricated to operate at a lower supply voltage (e.g. 1.8 volts) without requiring the bulk connection of the transistor 108 to be coupled to a particular voltage supply. In a particular embodiment, the transistor 108 may be a p-channel metal oxide semiconductor (PMOS) transistor. For example, the transistor 108 may have a requirement that a voltage difference between any of its four terminals (i.e., drain, source, gate, and bulk) not exceed a particular voltage in order for the transistor to operate with a high reliability. By coupling the bulk connection of the transistor 108 to the common mode connection 122, the transistor 108 may operate at a higher voltage than the lower supply voltage associated with the output element 102 while closely maintaining the reliability of the transistor. Since the bulk connection is coupled to the common mode connection 122, the transistor 108 may operate at a higher supply voltage that may be used by the receiver side and still closely maintain its reliability.

During operation, the output element 102 provides output signals to the terminals 104 and 106. The resistive elements 114 and 116 provide a common mode voltage at the node 120 that is provided to the bulk connection of the transistor 108. The transistor 108 may be turned on depending on the impedance control signal imp<x> that is provided to the gate of the transistor 108. If the transistor 108 is turned on, the resistive elements 110 and 112 contribute to an output impedance of the multi-terminal output with a common mode connection 100. Turning off the transistor 108 may substantially reduce or eliminate the contribution of the resistive elements 110 and 112 to the output impedance.

The output impedance may be adjusted to match or substantially match the output impedance of the multi-terminal output with a common mode connection 100 with an impedance of transmission lines coupled to the output element 102. When the output element 102 is coupled to a receiver side that uses a receiver supply voltage that is higher than a supply voltage that is used at the output element 102, the reliability of the transistor 108 may be closely maintained by providing the bulk bias (vbulk) at node 120 to the bulk connection of the transistor 108.

To illustrate, the bulk bias (vbulk) at the node 120 may represent a voltage that is close in level to a receiver supply voltage used at a receiving device (e.g., 3.3 volts). By applying the bulk bias (vbulk), which may be close to the receiver supply voltage (e.g., 3.3 volts), to the bulk connection of the transistor 108, an operating point of the transistor 108 may fall within design criteria to provide the high reliability of the transistor 108 (as compared to operating at the high voltage supply without the bulk connection coupled to the common mode connection 122).

By providing the impedance control signal (imp<x>) to the gate of the transistor 108, an output impedance may be adjusted to substantially match an impedance of transmission lines that are coupled to the first output terminal 104 and the second output terminal 106 while reducing reliability risks associated with receivers that operate at a higher supply voltage. Further, by generating the common mode voltage (vbulk) at the common mode connection 122 of the output element 102 between the first terminal 104 and the second terminal 106 and providing the common mode voltage (vbulk) to the bulk connection of the transistor 108, a transmitting device that incorporates the multi-terminal output with a common mode connection 100 may be operated at a lower power supply while using an open drain output that is coupled to a receiving device that operates at a higher supply voltage, such as a receiving device that operates according to an HDMI standard. Lower voltage supplies and smaller devices may be used in transmitter devices without substantially reducing a reliability of transistors in the resistor network, such as the transistor 108. As a result, lower power operation and increased device reliability may be obtained.

Figure 2:
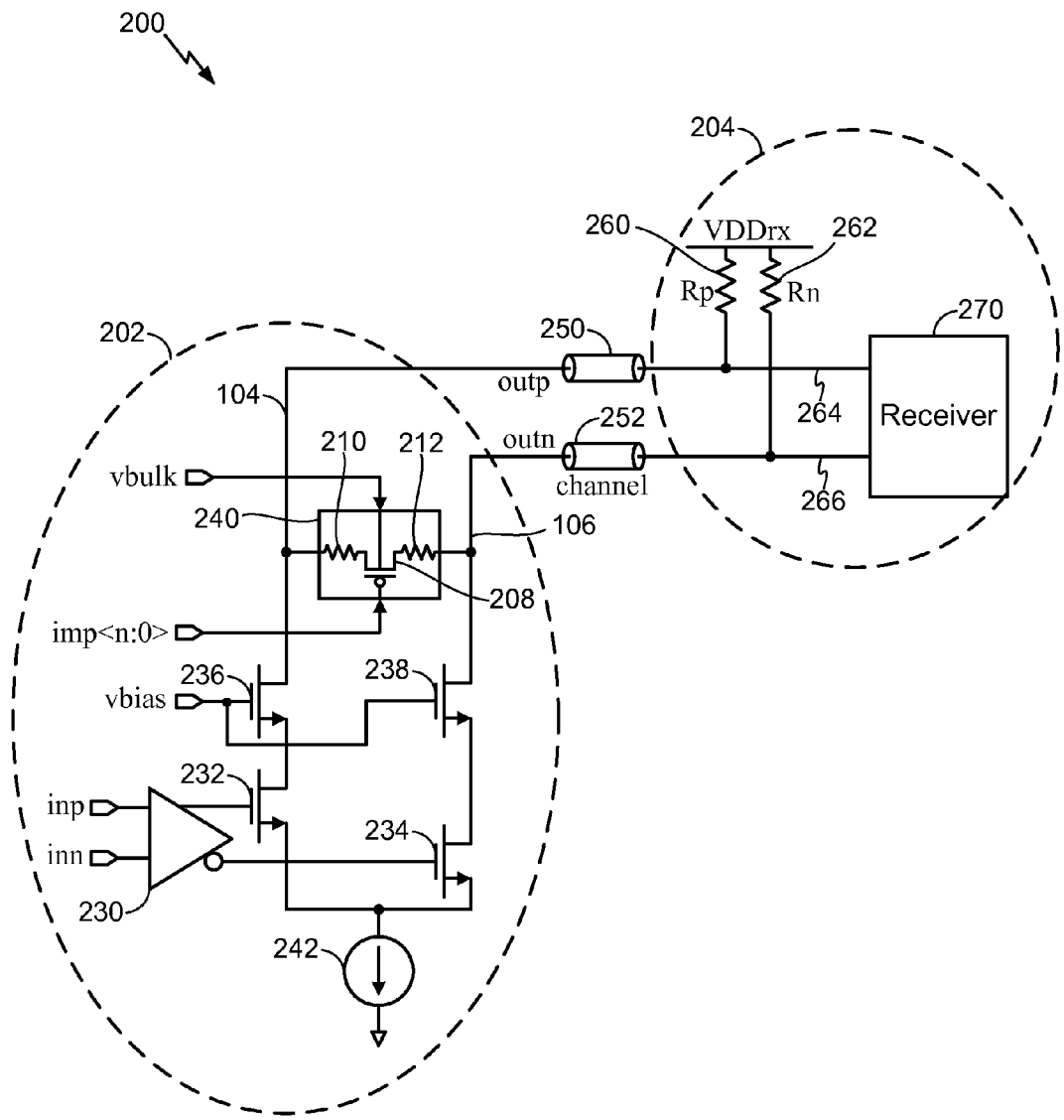
FIG. 2 is a diagram of a particular embodiment of a system including a particular illustrative implementation of the multi-terminal output with a common mode connection of FIG. 1.

Referring to FIG. 2, an illustrative embodiment of a system that includes a driver 202 is depicted and generally designated 200. The driver 202 is an output driver and is an illustrative implementation of the multi-terminal output with a common mode connection 100 of FIG. 1. The system 200 also includes transmission lines 250, 252 and a receiver side 204. The driver 202 is coupled to the receiver side 204 via the transmission lines 250, 252.

The driver 202 is a circuit that includes a resistor network 240 that is coupled between the first terminal 104 and the second terminal 106. The first terminal 104 is coupled to a drain of a first transistor 236. A drain of a second transistor 238 is coupled to the second terminal 106. A source of the first transistor 236 is coupled to a drain of a third transistor 232. A source of the third transistor 232 is coupled to a current source 242. A source of the second transistor 238 is coupled to a drain of a fourth transistor 234. A source of the fourth transistor 234 is coupled to the current source 242.

A gate of the first transistor 236 and a gate of the second transistor 238 are coupled to receive a gate bias signal (vbias). An output buffer 230 generates an inverted output signal that is provided to a gate of the fourth transistor 234 and a non-inverted output signal that is provided to a gate of the third transistor 232. A driver supply voltage (not shown) may be provided to the output buffer 230.

The first terminal 104 is coupled to a first transmission line 250, and the second terminal 106 is coupled to a second transmission line 252. The first transmission line 250 is coupled to a receiver side 204 that includes a first pull up resistor 260 and a receiver 270. The second transmission line 252 is coupled to a second pull up resistor 262 and to the receiver 270. An output impedance of the driver 202 may be adjusted by controlling one or more input signals (imp<n:0>) provided to the resistor network 240, where n is a positive integer. A value of n may correspond to an amount of precision that can be applied when adjusting the output impedance of the driver 202.

In a particular embodiment, the first transistor 236 and the second transistor 238 provide an open drain output of the driver 202 to the transmission lines 250 and 252. The first transistor 236 and the second transistor 238 are respectively responsive to the third transistor 232 and to the fourth transistor 234. The output buffer 230 is configured to generate a differential signal that includes the non-inverting output signal and the inverting output signal. The third transistor 232 and the fourth transistor 234 are respectively controlled by the non-inverting output signal and the inverting output signal.

In a particular embodiment, the resistor network 240 includes a first resistive element 210 and a second resistive element 212. The first resistive element 210 may be coupled to the first terminal 104, and the second resistive element 212 may be coupled to the second terminal 106. In addition, the first resistive element 210 and the second resistive element 212 may each be coupled to a transistor 208. The transistor 208 may have a gate that is responsive to at least one of the impedance control signals (imp<n:0>) and may have a bulk connection that is coupled to a common mode connection, such as the common mode connection 122 of FIG. 1. The bulk bias (vbulk) may be provided to the bulk connection of the transistor 208. Further detail of a particular embodiment of the resistor network 240 is provided with reference to FIG. 3.

The first pull up resistor 260 is configured to provide a pull up voltage (VDDrx) to the first transmission line 250, and the second pull up resistor 262 is configured to provide the pull up voltage (VDDrx) to the second transmission line 252. As a result of the pull up operation by the pull up resistors 260 and 262, a voltage at the first terminal 104 and a voltage at the second terminal 106 may be pulled up close to the pull up voltage (VDDrx). The receiver 270 may receive the differential signal from the driver 202 via a first input 264 that is coupled to the first transmission line 250 and via a second input 266 that is coupled to the second transmission line 252.

During operation, a supply voltage (not shown) is provided to the output buffer 230. Transitions in buffer input signals (inp) and (inn) may cause the non-inverting output signal and the inverting output signal generated by the output buffer 230 to toggle. The non-inverting output signal and the inverting output signal may turn on the third transistor 232 and the fourth transistor 234 respectively. The gate bias signal (vbias) may turn on the first transistor 236 and the second transistor 238. The voltage at the first terminal 104 and the voltage at the second terminal 106 may be pulled up close to the pull up voltage (VDDrx) by the pull up resistors 260 and 262 that are respectively coupled to the transmission lines 250 and 252. Since the first transistor 236 and the second transistor 238 are coupled to the first terminal 104 and the second terminal 106, transmission power loss may occur without adjustment of the output impedance of the driver 202. The output impedance of the driver 202 may be adjusted by controlling the impedance control signals (imp<n:0>). Because the voltage at the first terminal 104 and the voltage at the second terminal 106 may be pulled up close to the pull up voltage (VDDrx), the impedance control signals (imp<n:0>) may be level shifted to a power domain that is based on the pull up voltage (VDDrx).

By controlling the impedance control signals (imp<n:0>), the output impedance of the driver 202 may be adjusted to match or substantially match an impedance of the transmission lines 250 and 252. For example, by turning on the transistor 208, the first resistive element 210 and the second resistive element 212 may contribute to the output impedance of the driver 202. Similarly, by turning off the transistor 208, the contribution of the first resistive element 210 and the second resistive element 212 to the output impedance of the driver 202 may be significantly reduced or eliminated. Further, by providing the bulk bias (vbulk) to the bulk connection of the transistor 208 in the resistor network 240, the voltage at the first terminal 104 and the voltage at the second terminal 106 may be pulled up to a voltage that may otherwise reduce a reliability of the transistor 208. Further, by providing the bulk bias (vbulk) to the bulk connection of the transistor 208, a transmitting device that incorporates the driver 202 may be operated at a lower power supply while using an open drain output that is coupled to a receiving device that operates at a higher supply voltage, such as a receiving device that operates according to an HDMI standard. Lower voltage supplies and smaller devices may be used in transmitter devices without reducing or substantially reducing a reliability of transistors, such as the transistor 208, that are coupled to the resistive elements 210 and 212 in the resistor network 240. As a result, lower power operation and increased device reliability may be obtained.

Figure 3:
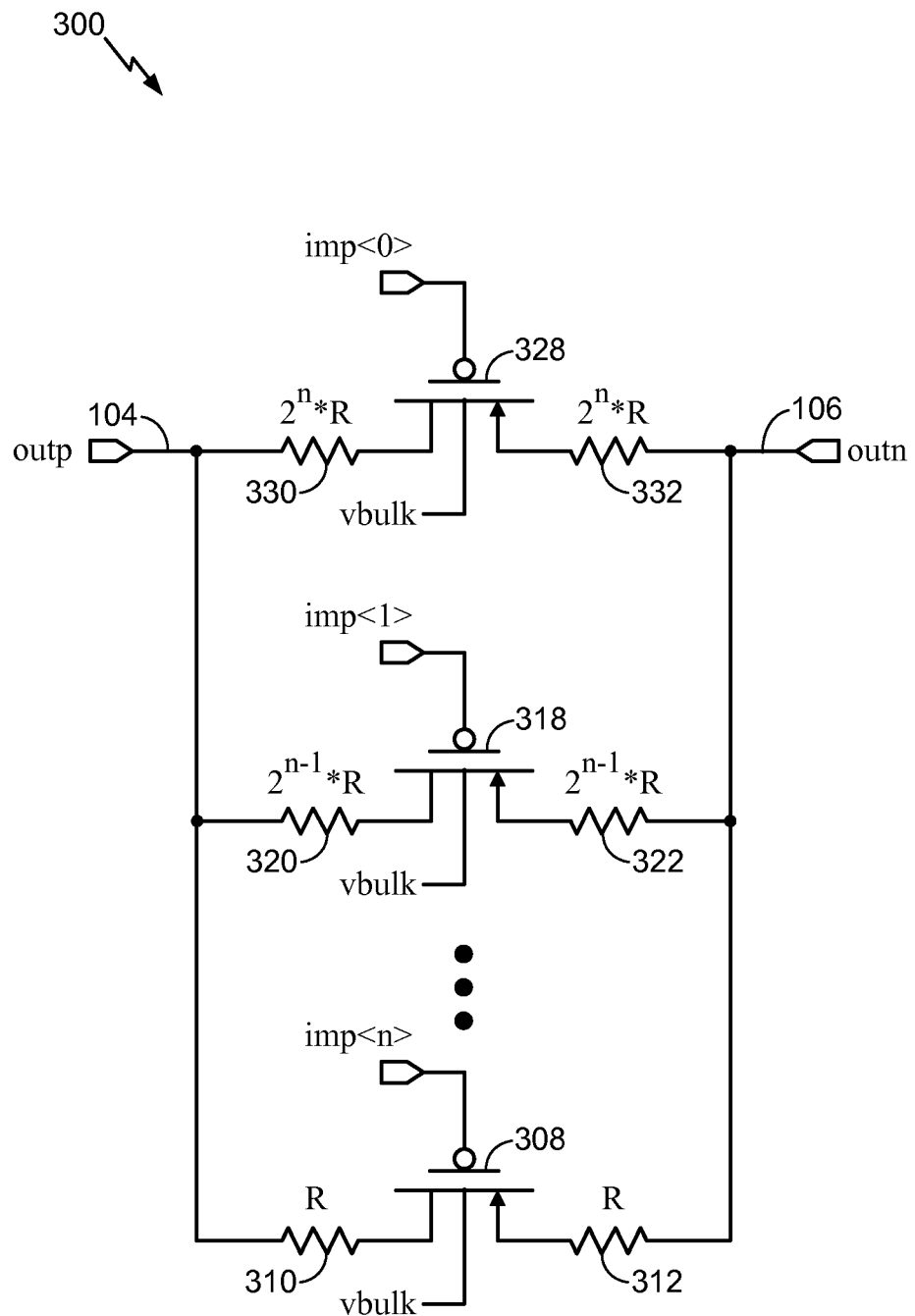
FIG. 3 is a diagram of a particular illustrative embodiment of a resistor network that may be implemented in the multi-terminal output with a common mode connection of FIG. 1 or 2.

Referring to FIG. 3, a particular embodiment of a resistor network is depicted and generally designated 300. In an illustrative embodiment, the resistor network 300 may be used for the resistor network 240 of FIG. 2. The resistor network 300 includes the first terminal 104 and the second terminal 106. A first resistor 310 is coupled to the first terminal 104 and to a first transistor 308. A second resistor 312 is coupled between the second terminal 106 and the first transistor 308. A third resistor 320 is coupled between the first terminal 104 and a second transistor 318. A fourth resistor 322 is coupled between the second terminal 106 and the second transistor 318. A fifth resistor 330 is coupled between the first terminal 104 and a third transistor 328. A sixth resistor 332 is coupled between the second terminal 106 and the third transistor 328. The transistors 308, 318, and 328 are independently biasable and may be individually activated or deactivated to obtain an impedance between the first terminal 104 and the second terminal 106. The impedance between the first terminal 104 and the second terminal 106 may contribute to the output impedance of an output, such as an output impedance of the driver 202 of FIG. 2. Because of the contribution of the impedance between the first terminal 104 and the second terminal 106, the output impedance of the driver 202 may be adjusted to match or substantially match the impedance of the transmission lines 250 and 252 depicted in FIG. 2.

Impedance control signals, such as the imp<n:0> of FIG. 2, may be received at the resistor network 300. A first component (imp<0>) of the impedance control signals may be provided to a gate of the third transistor 328, a second component (imp<1>) of the impedance control signals may be provided to a gate of the second transistor 318, and an $n^{th}$ component (imp<n>) of the impedance control signals may be provided to a gate of the first transistor 308. The impedance control signals (imp<n:0>) may be level shifted to a power domain that is based on a receiver side voltage, such as the pull up voltage (VDDrx) of FIG. 2. Each of the impedance control signals (imp<n:0>) may be a digital signal that selectively activates or deactivates a respective transistor 308, 318, 328. In a particular embodiment, the first component (imp<0>) corresponding to a first impedance control signal, the second component (imp<1>) corresponding to a second impedance control signal, and the third component (imp<n>) corresponding to a third impedance control signal. The impedance control signals may have a rail voltage that is substantially the same as a common mode voltage of a common mode connection.

Each of the transistors 308, 318, and 328 may be designed to operate with the bulk connection of the particular transistor coupled to the common mode connection or with the bulk connection of the particular transistor not coupled to the common mode connection. Each transistor 308, 318, 328 may have a high reliability if a voltage between a drain of the transistor 308, 318, 328 and a bulk connection of the transistor 308, 318, 328 and a voltage between the source of the transistor 308, 318, 328 and the bulk connection of the transistor 308, 318, 328 are below a threshold voltage. However, a reliability of the transistor 308, 318, 328 may be reduced if the voltage difference between the drain of the transistor 308, 318, 328 and the bulk connection of the transistor 308, 318, 328 and the voltage between the source of the transistor 308, 318, 328 and the bulk connection of the transistor 308, 318, 328 exceeds the threshold voltage. When the drain and the source of a particular transistor 308, 318, or 328 are coupled to a low voltage supply, operating the particular transistor 308, 318, or 328 with the bulk connection of the particular transistor 308, 318, or 328 not coupled to the common mode connection may not reduce a reliability of the particular transistor 308, 318, or 328. When the drain and the source of a transistor 308, 318, or 328 are coupled to a high voltage supply, providing the bulk bias (vbulk) to the bulk connection of the transistor 308, 318, or 328 may maintain the voltage between the drain/source of the transistor 308, 318, 328 and the bulk connection of the transistor 308, 318, 328 below the threshold voltage.

To illustrate, each transistor 308, 318, 328 may be designed to operate with a high reliability at a 1.8 volt supply without coupling the bulk connection of the transistor 308, 318, 328 to a common mode connection. However, when the first and second terminals 104, 106 are coupled to the pull up resistors 260 and 262 of FIG. 2 via the transmission lines 250 and 252 of FIG. 2, the voltage at the first and second terminals 104, 106 may exceed 1.8 volts. For example, the voltage at the first terminal 104 and the voltage at the second terminal 106 may be close to 3.3 volts as a result of the pull up resistors 260 and 262 and the supply voltage (VDDrx) of FIG. 2. The bulk connections of each of the transistors 308, 318, and 328 may be coupled to common node connections, such as the common node connection at the node 120 illustrated in FIG. 1. By coupling the bulk connection of each of the transistors 308, 318, 328 to the common mode connection, the transistors 308, 318, 328 may operate while maintaining a high reliability. Operating the transistors 308, 318, 328 without coupling the bulk connection of the transistors 308, 318, and 328 to a common mode connection may reduce a reliability of the transistors 308, 318, and 328.

During operation, the voltage at the first terminal 104 and the voltage at the second terminal 106 may be pulled up close to the receiver side voltage, such as the pull up voltage (VDDrx) of FIG. 2. The bulk bias (vbulk) may be provided to the bulk connection of the transistors 308, 318, and 328. The components (imp<0>, imp<1>, and imp<n>) of the impedance control signals (imp<n:0>) may turn on or turn off corresponding transistors 308, 318, and 328. The resistor pairs 310/312, 320/322, and 330/332 that are coupled to the transistors 308, 318, and 328 that are turned on may contribute to the impedance between the first terminal 104 and the second terminal 106. In turn, the impedance between the first terminal 104 and the second terminal 106 may contribute to the output impedance of an output, such as the driver 202 of FIG. 2. Because of a contribution of the impedance between the first terminal 104 and the second terminal 106, the output impedance of the driver 202 may match or substantially match the impedance of the transmission lines in 250 and 252 depicted in FIG. 2.

By controlling the impedance control signals (imp<n:0>), the impedance between the first terminal 104 and the second terminal 106 may be adjusted to contribute to an output impedance of an output, such as the driver 202 of FIG. 2, so that the output impedance of the output matches or substantially matches an impedance of the transmission lines 250 and 252. Further, by providing the bulk bias (vbulk) to the bulk connection of the transistors 308, 318, and 328, the voltage at the first terminal 104 and the voltage at the second terminal 106 may be pulled up to a voltage that may otherwise reduce a reliability of the transistors 308, 318, and 328. Thus, a transmitting device that incorporates a driver, such as the driver 202, may be provided a lower power supply at the transmitting device side while coupled to a receiving device that operates at a higher supply voltage, such as a receiving device that operates according to an HDMI standard.

Although FIG. 3 illustrates three transistors 308, 318, and 328 and the corresponding resistor pairs 310/312, 320/322, and 330/332, the number of transistors and corresponding resistor pairs may be fewer than three or more than three in alternative embodiments.

Figure 4:
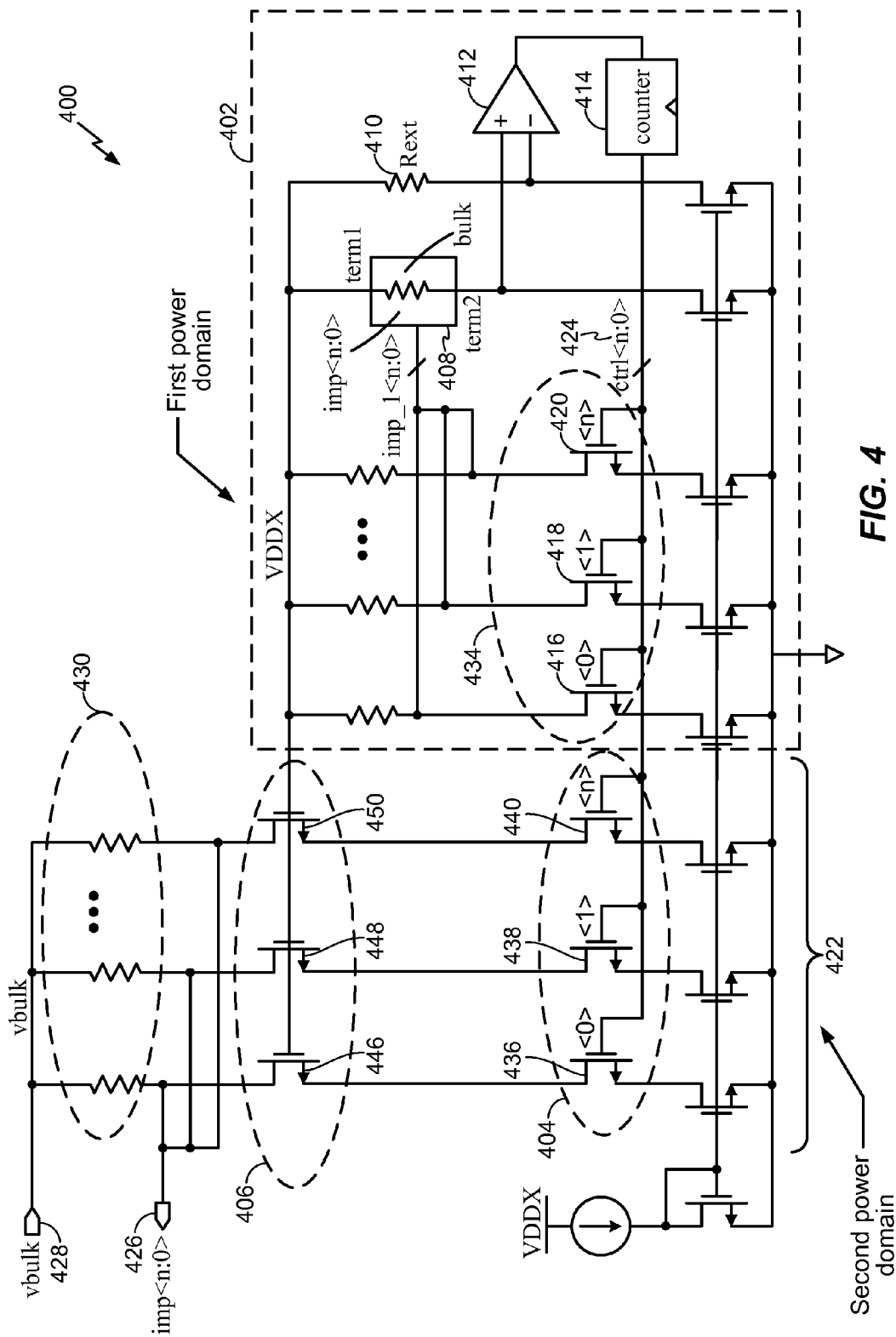
FIG. 4 is a diagram of a particular illustrative embodiment of a calibration system that may be implemented in a transmitter that includes the multi-terminal output with the common mode connection of FIG. 1 or the driver of FIG. 2.

Referring to FIG. 4, a particular embodiment of a calibration system is depicted and generally designated 400. The system 400 is configured to provide impedance control signals (imp<n:0>) that may be provided to the resistor network 240 of FIG. 2 and 300 of FIG. 3. The system 400 includes a calibration component 402 coupled to a level shifting component 422. The calibration component 402 provides control signals (ctrl<n:0>) 424 to the level shifting component 422. The calibration component 402 is in a first power domain that is based on a supply voltage (VDDX). For example, the supply voltage (VDDX) may be 1.8 volts. The level shifting component 422 is in a second power domain that is based on the bulk bias (vbulk) 428 corresponding to a common mode voltage at a common mode connection, such as the common mode connection 122 of FIG. 1. For example, the bulk bias (vbulk), which is a common mode voltage, may be close to 3.3 volts.

The calibration component 402 includes an operational amplifier 412 coupled to an input of a counter 414. The counter 414 generates the control signals (ctrl<n:0>) 424 that are provided to a first set of transistors 434. The first set of transistors 434 is in the first power domain and includes a first transistor 420, a second transistor 418, and a third transistor 416. The control signals (ctrl<n:0>) 424 are provided to gates of the first transistor 420, the second transistor 418, and the third transistor 416, and to the level shifting component 422. The control signals (ctrl<n:0>) 424 may have a rail voltage level associated with the first power domain. Each transistor 416, 418, 420 is coupled to a path between the supply voltage (VDDX) and ground. The outputs of the transistors 416, 418, 420 are coupled to a resistor network 408 and provide impedance signals (imp_1<n:0>) to the resistor network 408. The supply voltage (VDDX) is provided to a first terminal (term1) of the resistor network 408. A second terminal (term2) of the resistor network 408 is coupled to a first input of the operational amplifier 412. A second input of the operational amplifier 412 is coupled to a calibration resistive element 410. The supply voltage (VDDX) is also provided to the calibration resistive element 410.

The calibration resistive element 410 may be a configurable resistor that may have a configurable resistance. Alternatively, the calibration resistive element 410 may be a resistor that can be easily swapped with another resistor of the same or different resistance. The calibration resistive element 410 may be selected to obtain a desired impedance between the first and second terminals 104, 106 of FIGS. 2 and 3 by controlling the impedance control signals (imp<n:0>) 426 that are generated based on the control signals (ctrl<n:0>) 424 and provided to the resistor network 240 of FIGS. 2 and 300 of FIG. 3. In a particular embodiment, the calibration resistive element 410 may be a resistor that is external to the calibration system 400.

The level shifting component 422 includes a second set of transistors 404, a third set of transistors 406, and a set of resistive elements 430. The second set of transistors 404 is in the second power domain and includes a fourth transistor 436, a fifth transistor 438, and a sixth transistor 440, and the third set of transistors 406 includes a seventh transistor 446, an eighth transistor 448, and a ninth transistor 450. The second set of transistors 404 is responsive to the first set of transistors 434 and controls a resistor network (e.g., the resistor network 240 of FIG. 2 or 300 of FIG. 3). Each transistor 436, 438, 440 in the second set of transistors 404 is coupled to a component of the control signals (ctrl<n:0>) 424. A gate of the fourth transistor 436 is coupled to a first component (ctrl<0>), a gate of the fifth transistor 438 is coupled to a second component (ctrl<1>), and a gate of the sixth transistor 440 is coupled to an $n^{th}$ component (ctrl<n>). Each transistor 436, 438, 440 in the second set of transistors 404 is coupled to a corresponding transistor 446, 448, or 450 in the third set of transistors 406. For example, the fourth transistor 436 is coupled to the seventh transistor 446, the fifth transistor 438 is coupled to the eighth transistor 448, and the sixth transistor 440 is coupled to the ninth transistor 450. The bulk bias (vbulk) is provided to the third set of transistors 406 via the set of resistive elements 430 and the second set of transistors 406.

The supply voltage (VDDX) is provided to a gate of each transistor 446, 448, 450 in the third set of transistors 406. The outputs of transistors 446, 448, 450 combine to provide the impedance control signals (imp<n:0>) 426 that are provided to the resistor network 240 of FIG. 2 and 300 of FIG. 3. The impedance control signals (imp<n:0>) 426 have a second rail voltage level associated with the second power domain. The bulk bias (vbulk) is provided to the third set of transistors 406 via the set of resistive elements 430. Each resistive element in the set of resistive elements 430 has a first terminal that is biased at the bulk bias (vbulk). Each transistor 446, 448, or 450 in the third set of transistors 406 is coupled to a second terminal of a corresponding resistive element in the set of resistive elements 430.

During operation, the operational amplifier 412 may generate a signal that is provided to the counter 414. The operational amplifier 412 generates the signal based on the first and second inputs of the operational amplifier 412, which are respectively coupled to the resistor network 408 and the calibration resistive element 410. The counter 414 may change the control signals (ctrl<n:0>) 424 based on a first value of the signal from the operational amplifier 412. The counter 414 may stop changing the control signals (ctrl<n:0>) 424 based on a second value of the signal from the operational amplifier 412. For example, the counter may change the control signals (ctrl<n:0>) 424 if the signal from the operational amplifier 412 is high and may stop changing the control signals (ctrl<n:0>) 424 if the signal from the operational amplifier 412 is low. The control signals (ctrl<n:0>) 424 may have a rail voltage level (e.g., 1.8 volts) that is close to the supply voltage (VDDX).

The transistors 416, 418, 420 may be turned on or turned off depending on the control signals (ctrl<n:0>) 424. The impedance signals (<imp_1<n:0>) that are coupled to the resistor network 408 are generated according to which ones of the transistors 416, 418, 420 in the first set of transistors 434 are turned on or turned off by the control signals (ctrl<n:0>) 424. The control signals (ctrl<n:0>) 424 are also provided to the second set of transistors 404 that are coupled to the third set of transistors 406. The third set of transistors 406 may be turned on by the supply voltage (VDDX). Each transistor 436, 438, 440 in the second set of transistors 404 may be turned on or turned off depending on the control signals (ctrl<n:0>) 424. By turning on or off the transistors 436, 438, and 440 in the second set of transistors 404, the control signals (ctrl<n:0>) 424 control the impedance control signals (imp<n:0>) 426 provided to the resistor network 240 of FIG. 2 and 300 of FIG. 3. Since the bulk bias (vbulk) is provided to the third set of transistors 406, the impedance control signals (imp<n:0>) 426 may have a rail voltage level (e.g., 3.3 volts) that is close to the bulk bias (vbulk).

The impedance control signals (imp<n:0>) 426 are provided to a resistor network, (e.g., the resistor network 240 of FIG. 2 or 300 of FIG. 3). Transistors (e.g., the transistors 308, 318, 328 of FIG. 3) in the resistor network are coupled to the first and second terminals 104 and 106 of FIGS. 1-3. Since a voltage at the first and second terminals 104 and 106 may be pulled up close to a receiver side voltage (e.g., 3.3 volts), the impedance control signals (imp<n:0>) that have a rail voltage level that is close to the bulk bias (vbulk) (e.g., 3.3 volts) enable a normal operation of the transistors. In turn, the normal operation of the transistors enables adjustment of the impedance between the first terminal 104 and the second terminal 106 of FIGS. 1-3.

Although FIG. 4 illustrates an input to the counter 414 being provided by the operational amplifier 412, in other embodiments the input to the counter 414 may be provided by a comparator. Further, while three transistors 416, 418, and 420 are shown in the calibration component 402, the number of transistors may be fewer than three or more than three in alternative embodiments. For example, one or two transistors may be used. Similarly, the number of transistors in the second and third sets of transistors 404 and 406 may include more than three transistors or fewer than three transistors.

Figure 5:
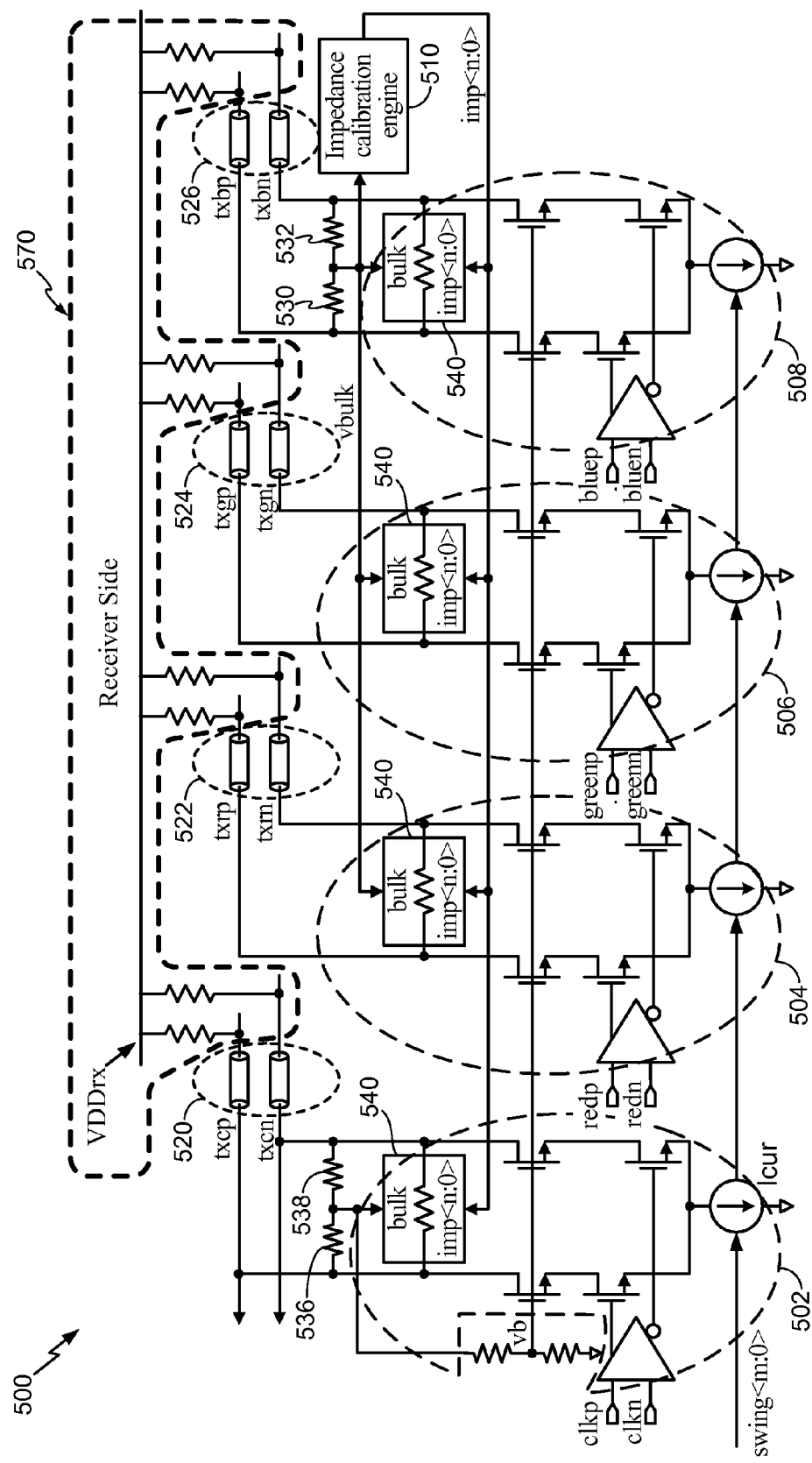
FIG. 5 is a diagram of a particular illustrative system that includes multiple drivers of FIG. 2.

Referring to FIG. 5, a particular embodiment of a system that includes multiple drivers is depicted and generally designated 500. The system 500 includes a first driver 502, a second driver 504, a third driver 506, and fourth driver 508. Each of the drivers 502, 504, 506, and 508 is coupled to a receiver side circuit 570 via transmission lines illustrated as a first transmission line pair 520, a second transmission line pair 522, a third transmission line pair 524, and a fourth transmission line pair 526. The impedance calibration engine 510 is configured to provide impedance control signals (imp<n:0>) to the drivers 502, 504, 506, and 508. The impedance calibration engine 510 may adjust the impedance control signals (imp<n:0>) to adjust impedance of the drivers 502, 504, 506, and 508. For example, the impedance calibration engine 510 may correspond to the system 400 illustrated in FIG. 4.

In a particular embodiment, each of the drivers 502, 504, 506, 508 corresponds to the driver 202 of FIG. 2. In a particular embodiment, the first driver 502 may be a clock driver. The first driver 502 includes an output buffer having an inverting output and a non-inverting output that are used to drive transistors that are coupled to open drain transistors. The open drain transistors are coupled to first and second terminals. The first driver 502 also includes a resistor network 540, which may correspond to the resistor network 300 of FIG. 3. As illustrated, the resistor network 540 may be coupled to a first output terminal and a second output terminal of the first driver 502. The resistor network 540 may be responsive to the impedance control signals (imp<n:0>) that are used to adjust an impedance of the first driver 502 to match or substantially match an impedance of the transmission line pair 520. The bulk connections of transistors in the resistor network 540 are coupled to a common mode connection of the output terminals of the first driver 502. Coupling the bulk connection of the transistors in the resistor network 540 to a common mode connection preserves a reliability of the transistors in the event pull up voltage (VDDrx) used at the receiver side 570 would pose a risk to the reliability of the transistors, such as described with respect to FIGS. 2 and 3. Each of the other drivers 504, 506, and 508 operates in a similar manner as described above with respect to driver 502 and the driver 202 of FIG. 2. In a particular embodiment, each of the drivers 504, 506, and 508 may be a data driver. Each driver 504, 506, 508 includes a resistor network 540 that is coupled to a first output terminal and a second output terminal of each driver 504, 506, 508.

As illustrated, the system 500 of FIG. 5 may be incorporated in an HDMI transmitter, where the first driver 502 corresponds to a clock driver, the second driver 504 corresponds to a red driver, the third driver 506 corresponds to a green driver, and the fourth driver 508 corresponds to a blue driver.

During operation, the impedance calibration engine 510 provides the impedance control signals (imp<n:0>) to the drivers 502, 504, 506, and 508. The impedance control signals (imp<n:0>) may adjust the output impedances of each of the drivers 502, 504, 506, and 508. The bulk bias (vbulk) is provided to the resistor network 540 inside the drivers 504, 506, and 508. A common mode voltage at the common mode connection of the outputs of the first driver 502 is provided to the resistor network 540 inside the first driver 502. Each driver 502, 504, 506, and 508 generates output signals for transmission to the receiver side 570 via corresponding transmission lines 520, 522, 524, and 526.

Output impedances of the drivers 502, 504, 506, and 508 may be adjusted to match or substantially match the impedances of corresponding transmission line pairs 520, 522, 524, and 526. By adjusting an output impedance of the first driver 502 to match or substantially match an impedance of the transmission line pair 520, reflection loss due to impedance mismatch between the first driver 502 and the first transmission line pair 520 may be reduced. Similarly, reflection losses due to impedance mismatch between the other drivers 504, 506, and 508 and their corresponding transmission line pairs 522, 524, and 526 may also be reduced. Further, by coupling the bulk connections of transistors inside each resistor network 540, the reliability of the transistors in each resistor network 540 may be substantially maintained.

Figure 6:
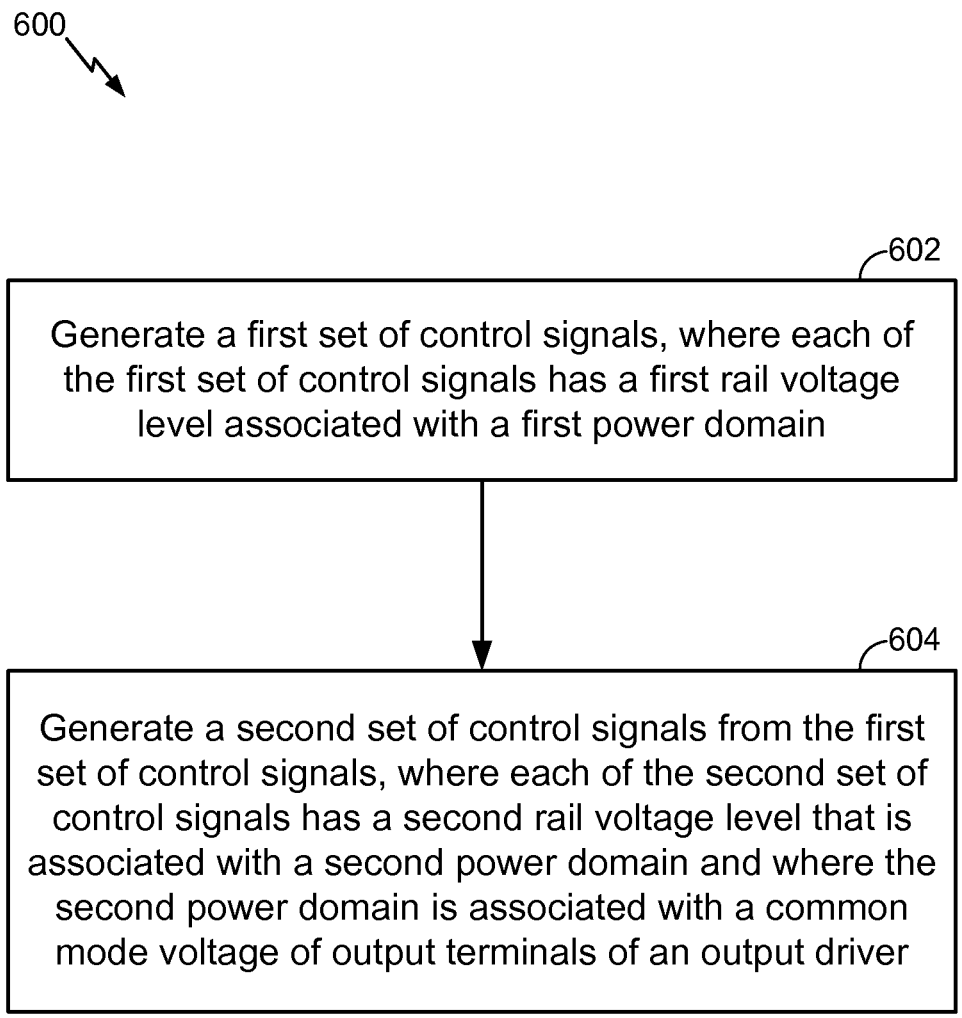
FIG. 6 is a flow chart of a particular illustrative embodiment of a method of operating the calibration system of FIG. 3 that may be used to calibrate the multi-terminal output with the common mode connection of FIG. 1 or the driver of FIG. 2.

Referring to FIG. 6, a particular illustrative embodiment of a method of operating a multi-terminal output with a common mode connection is illustrated. The method 600 includes generating a first set of control signals, at 602. For example, the control signals (ctrl<n:0>) 424 may be generated by the calibration component 402 of FIG. 4. Each of the first set of control signals has a first rail voltage level associated with a first power domain. For example, the control signals (ctrl<n:0>) 424 may have a rail voltage level that is associated with the first power domain of FIG. 4.

The method 600 further includes generating a second set of control signals from the first set of control signals, at 604. For example, the impedance control signals (imp<n:0>) 426 of FIG. 4 may be generated by the level shift component 422 of FIG. 4. Each of the second set of control signals has a second rail voltage level that is associated with a second power domain. The second power domain is associated with a common mode voltage of output terminals of an output driver. For example, the impedance control signals (imp<n:0>) 426 may have a rail voltage level that is associated with the second power domain of FIG. 4. The second power domain may be associated with the bulk bias (vbulk), which may be provided by the common mode connection of the first and second terminals 104 and 106 of the multi-terminal output with a common mode connection of FIG. 1. In a particular embodiment, the second rail voltage level that is associated with the second power domain is higher than the first rail voltage level that is associated with the first power domain.

The method 600 of FIG. 6 may be implemented by an application-specific integrated circuit (ASIC), a field-programmable gate array (FPGA) device, a processing unit such as a central processing unit (CPU), a digital signal processor (DSP), a controller, another hardware device, firmware device, or any combination thereof. As an example, the method of FIG. 4 can be performed by a processor that executes instructions, as described with respect to FIG. 7.

Figure 7:
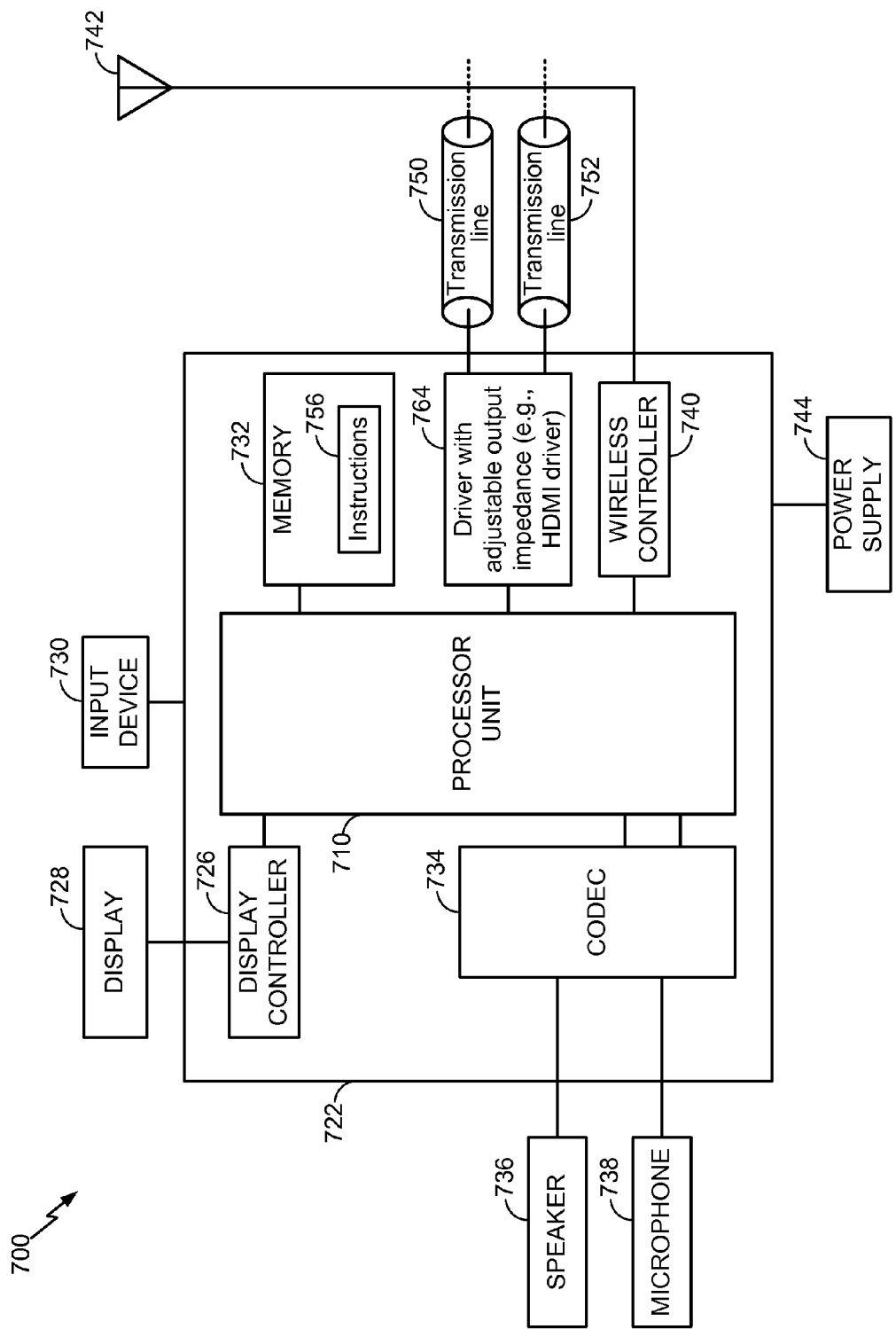
FIG. 7 is a block diagram of wireless device including a driver with an adjustable output impedance.

Referring to FIG. 7, a block diagram of a particular illustrative embodiment of a wireless communication device is depicted and generally designated 700. The device 700 includes a processor unit 710, such as a digital signal processor (DSP), coupled to a memory 732 and a wireless controller 740. The device 700 may include one or more drivers (e.g., a driver with adjustable output impedance 764) coupled to the processor unit 710. In an illustrative embodiment, the driver with adjustable output impedance 764 may correspond to the multi-terminal output with a common mode connection 100 of FIG. 1, the driver 202 of FIG. 2, the driver 502 of FIG. 5, the driver 504 of FIG. 5, the driver 506 of FIG. 5, or the driver 508 of FIG. 5, or may operate according to the method of FIG. 6, or any combination thereof. In a particular embodiment, the driver with adjustable output impedance 764 may be coupled to transmission lines 750 and 752. Although the driver with adjustable output impedance 764 is illustrated as coupled to the processor unit 710, in other embodiments, the driver with adjustable output impedance 764 may be integrated within the processor unit 710.

The memory 732 may be a non-transient computer readable medium storing computer-executable instructions 756 that are executable by the processor unit 710 to cause the processor unit 710 to process data received via a wireless controller 740. For example, the received data may be based on voice or video signals received via a wireless antenna 742. The computer-executable instructions 756 may include instructions that are executable by the processor unit 710 to cause the processor unit 710 to process received data and to generate output data that is formatted for audio output. The computer-executable instructions 756 may also include instructions that are executable by the processor unit 710 to cause the processor unit 710 to process received data and to generate output data that is formatted for display.

In a particular illustrative embodiment, the computer-executable instructions 756 may include instructions that are executable by the processor unit 710 to cause the processor unit 710 to generate a first set of control signals, where each of the first set of control signals has a first rail voltage level associated with a first power domain. The first set of control signals may be generated based on a resistor that has a configurable resistance. The resistor may be inside the driver with adjustable output impedance 764, or inside a transmitter, such as a high-definition multimedia interface (HDMI) compliant transmitter that is coupled to the processing unit 710. The computer-executable instructions 756 may also include instructions that are executable by the processor unit 710 to cause the processor unit 710 to generate a second set of control signals from the first set of control signals, where each of the second set of control signals has a second rail voltage level that is associated with a second power domain and where the second power domain is associated with a common mode voltage of outputs of the driver with adjustable output impedance 764. The second set of control signals may be used to adjust an output impedance of the driver with adjustable output impedance 764, such as described with respect to FIG. 4. In another embodiment, logic to generate the control signals is within the driver 764 instead of being implemented by some of the instructions 756. The logic within the driver 764 may include circuit elements as illustrated by the circuit 400 in FIG. 4.

FIG. 7 also shows a display controller 726 that is coupled to the digital signal processor unit 710 and to a display 728. A coder/decoder (CODEC) 734 can also be coupled to the processor unit 710. A speaker 736 and a microphone 738 can be coupled to the CODEC 734.

FIG. 7 also indicates that the wireless controller 740 can be coupled to the wireless antenna 742. In a particular embodiment, the processor unit 710, the display controller 726, the memory 732, the CODEC 734, the driver with adjustable output impedance 764, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

While FIG. 7 illustrates a particular embodiment of a wireless device 700, one or more drivers (e.g., the driver with adjustable output impedance 764) may be integrated in other electronic devices including a set top box, a music player, a video player, an entertainment unit, a navigation device, a communications device, a personal digital assistant (PDA), a fixed location data unit, and a computer integrated.

In conjunction with the described embodiments, a system is disclosed that may include means for generating a common mode voltage at a common mode connection, where the common mode connection is between a first terminal and a second terminal, such as the resistive elements 114, 116 of FIG. 1, the resistive elements 530, 532, 536, 538 of FIG. 5, one or more other devices or circuits configured to generate a common mode voltage at a common mode connection, or any combination thereof. The system may also includes means for adjusting an output impedance based on a first input and the common mode voltage, such as the transistor 108 of FIG. 1, the resistor network 240 of FIG. 2, the resistor network 300 of FIG. 3, one or more other devices or circuits configured to adjust an output impedance based on a first input and the common mode voltage, or any combination thereof.

Figure 8:
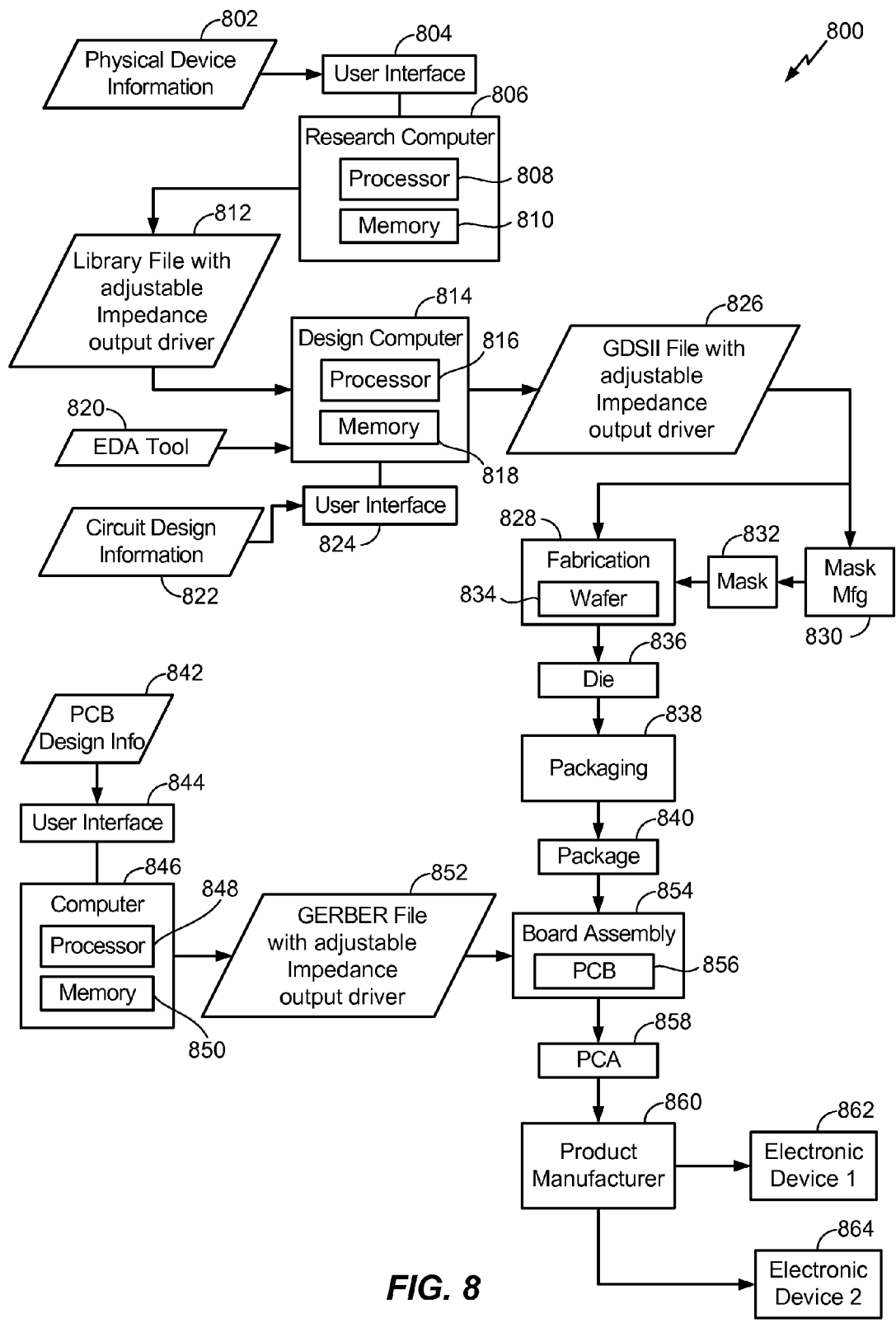
FIG. 8 is a data flow diagram of a particular illustrative embodiment of a manufacturing process to manufacture electronic devices that include a driver with an adjustable output impedance.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received at the manufacturing process 800, such as at a research computer 806. The physical device information 802 may include design information representing at least one physical property of a semiconductor device, such as the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including a device that includes the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the multi-terminal output with a common mode connection 100 of FIG. 1, the driver 202 of FIG. 2, the resistor network 300 of FIG. 3, the calibration block 400 of FIG. 4, the drivers 502, 504, 506, and 508 of FIG. 5, or any combination thereof, in addition to other circuits or information. To illustrate, the data file may include information corresponding to a system-on-chip (SOC) that includes the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, and that also includes additional electronic circuits and components within the SOC.

The GDSII file 826 may be received at a fabrication process 828 to manufacture the multi-terminal output with a common mode connection 100 of FIG. 1, the driver 202 of FIG. 2, the resistor network 300 of FIG. 3, the calibration block 400 of FIG. 4, the drivers 502, 504, 506, and 508 of FIG. 5, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes a circuit including a device that includes the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer, into which the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these illustrated units. Embodiments of the disclosure may be suitably employed in any device which includes active integrated circuitry including memory and on-chip circuitry.

A device that includes the multi-terminal output with a common mode connection of FIG. 1, the driver 202 of FIG. 2, the resistor network 300 of FIG. 3, the calibration block 400 of FIG. 4, the drivers 502, 504, 506, and 508 of FIG. 5, or any combination thereof, may be fabricated, processed, and incorporated into an electronic device, as described in the illustrative process 800. One or more aspects of the embodiments disclosed with respect to FIGS. 1-5 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
an output element having a first terminal and a second terminal and having a common mode connection between the first terminal and the second terminal, wherein the output element is configured to apply a differential signal at the first terminal and at the second terminal, and wherein the common mode connection is configured to generate a common mode voltage of the differential signal;
a first transistor having a bulk connection, the bulk connection coupled to the common mode connection, wherein the first transistor is coupled to the first terminal via a first resistor with a first resistance; and
a second transistor having the bulk connection, wherein the second transistor is coupled to the first terminal via a second resistor with a second resistance, and wherein the second resistance is greater than the first resistance.

2. The circuit of claim 1, further comprising a third transistor and a fourth transistor, wherein the first transistor is coupled to the first terminal and wherein the second transistor is coupled to the second terminal.

3. The circuit of claim 2, wherein a first drain of the third transistor is coupled to the first terminal, wherein a second drain of the fourth transistor is coupled to the second terminal, wherein a first source terminal of the third transistor is coupled to a fifth transistor, and wherein a second source terminal of the fourth transistor is coupled to a sixth transistor.

4. The circuit of claim 1, wherein the second resistance is twice the first resistance.

5. The circuit of claim 1, wherein the first transistor is a p-channel metal oxide semiconductor (PMOS) transistor.

6. The circuit of claim 1, wherein multiple transistors are configured to control a resistive network that is coupled to the first terminal and the second terminal.

7. The circuit of claim 6, wherein a third transistor of the multiple transistors is coupled to the first terminal via a third resistor of the resistive network, wherein the third transistor of the multiple transistors is coupled to the second terminal via a fourth resistor of the resistive network, wherein a fourth transistor of the multiple transistors is coupled to the first terminal via a fifth resistor of the resistive network, and wherein the fourth transistor of the multiple transistors is coupled to the second terminal via a sixth resistor of the resistive network.

8. The circuit of claim 1, wherein a first impedance control signal is provided to a first gate of the first transistor and wherein a second impedance control signal is provided to a second gate of the second transistor.

9. The circuit of claim 8, further comprising impedance control circuitry to generate the first impedance control signal and the second impedance control signal, wherein the first impedance control signal and the second impedance control signal have a first rail voltage that is substantially the same as the common mode voltage of the common mode connection.

10. The circuit of claim 9, wherein the first impedance control signal and the second impedance control signal are generated by the impedance control circuitry based on level shifting control signals that have a second rail voltage that is lower than the common mode voltage.

11. The circuit of claim 1 integrated in at least one semiconductor die.

12. The circuit of claim 1, further comprising a set top box, a music player, a video player, an entertainment unit, a navigation device, a communications device, a personal digital assistant (PDA), a fixed location data unit, a computer, or a combination thereof, into which the transistor is integrated.

13. An apparatus comprising:
means for generating a common mode voltage at a common mode connection, wherein the common mode connection is between a first terminal and a second terminal, wherein the means for generating is configured to apply a differential signal at the first terminal and at the second terminal, and wherein the common mode connection is configured to generate a common mode voltage of the differential signal;
first means for adjusting an output impedance based on a first input, the common mode voltage, and a first impedance between the first means for adjusting the output impedance and the first terminal;
second means for adjusting the output impedance based on a second input, the common mode voltage, and a second impedance between the second means for adjusting the output impedance and the first terminal, wherein the second impedance is greater than the first impedance.

14. The apparatus of claim 13, further comprising means for providing an output to the first terminal and the second terminal.

15. The apparatus of claim 13, wherein the means for adjusting the output impedance is within a high-definition multimedia interface (HDMI) compliant transmitter.

16. A method comprising:
receiving a data file comprising design information corresponding to a semiconductor device; and
fabricating the semiconductor device according to the design information, wherein the semiconductor device comprises:
an output element having a first terminal and a second terminal and having a common mode connection between the first terminal and the second terminal, wherein the output element is configured to apply a differential signal at the first terminal and at the second terminal, and wherein the common mode connection is configured to generate a common mode voltage of the differential signal;
a first transistor having a bulk connection, the bulk connection coupled to the common mode connection, wherein the first transistor is coupled to the first terminal via a first resistor with a first resistance; and
a second transistor having the bulk connection, wherein the second transistor is coupled to the first terminal via a second resistor with a second resistance, and wherein the second resistance is greater than the first resistance.

17. The method of claim 16, wherein the data file has a GDSII format.

18. The method of claim 16, wherein the data file has a GERBER format.

19. The circuit of claim 1, wherein the common mode connection is further configured to provide the common mode voltage to the bulk connection.

20. The circuit of claim 1, wherein the first terminal comprises a first output terminal and the second terminal comprises a second output terminal.

21. The circuit of claim 8, wherein the first gate of the first transistor is responsive to the first impedance control signal to adjust an output impedance of the output element based on an impedance of one or more transmission lines.

22. The circuit of claim 8, further comprising impedance control circuitry to calibrate impedance of the first transistor by generating the first impedance control signal.

23. The circuit of claim 1, further comprising a third transistor having a gate connection and a drain connection, wherein the common mode voltage is from a first power domain, wherein the drain connection is coupled to the common mode connection, and wherein the gate connection is coupled to a supply voltage of a second power domain.

24. The circuit of claim 1, wherein coupling of the common mode connection to the bulk connection enables the transistor to operate at a higher voltage than an output voltage associated with the output element without reducing reliability of the transistor.

25. The apparatus of claim 13, wherein the common mode voltage varies based on the differential signal.

26. The apparatus of claim 13, wherein the common mode voltage is generated based on a power domain of a device coupled to the means for generating the common mode voltage.

27. The apparatus of claim 13, further comprising a third means for adjusting the output impedance based on the common mode voltage and a supply voltage, wherein the common mode voltage is from a first power domain, and wherein the supply voltage is from a second power domain.

28. The circuit of claim 1, wherein the first transistor is connected to the second terminal via a third resistor with the first resistance.

29. The circuit of claim 28, wherein the second transistor is connected to the second terminal via a fourth resistor with the second resistance.

30. A method comprising:
generating a common mode voltage at a common mode connection of an output element, wherein the common mode connection is between a first terminal and a second terminal, wherein the output element is configured to apply a differential signal at the first terminal and at the second terminal, and wherein the common mode voltage is a common mode voltage of the differential signal; and
adjusting an output resistance based on a first input of a first transistor receiving the common mode voltage and a first resistance of a first resistor between the first transistor and the first terminal, wherein the output resistance is further adjusted based on a second input of a second transistor receiving the common mode voltage and a second resistance of a second resistor between the second transistor and the first terminal, wherein the second resistance is greater than the first resistance.

31. The method of claim 30, wherein the output resistance is further adjusted based on a third resistor with the first resistance, the third resistor between the first transistor and the second terminal.

32. A non-transitory computer readable medium storing instructions that when executed cause a processor to perform operations comprising:
fabricating a semiconductor device, wherein the semiconductor device comprises:
an output element having a first terminal and a second terminal and having a common mode connection between the first terminal and the second terminal, wherein the output element is configured to apply a differential signal at the first terminal and at the second terminal, and wherein the common mode connection is configured to generate a common mode voltage of the differential signal;

a first transistor having a bulk connection, the bulk connection coupled to the common mode connection, wherein the first transistor is coupled to the first terminal via a first resistor with a first resistance; and a second transistor having the bulk connection, wherein the second transistor is coupled to the first terminal via a second resistor with a second resistance, and wherein the second resistance is greater than the first resistance.

33. The non-transitory computer readable medium of claim 32, wherein the first transistor is connected to the second terminal via a third resistor with the first resistance.

34. A method comprising:

a first step for generating a common mode voltage at a common mode connection of an output element, wherein the common mode connection is between a first terminal and a second terminal, wherein the output element is configured to apply a differential signal at the first terminal and at the second terminal, and wherein the common mode voltage is a common mode voltage of the differential signal;

a second step for adjusting an output resistance based on a first input of a first transistor receiving the common mode voltage and a first resistance of a first resistor between the first transistor and the first terminal, wherein the output resistance is further adjusted based on a second input of a second transistor receiving the common mode voltage and a second resistance of a second resistor between the second transistor and the first terminal, wherein the second resistance is greater than the first resistance.

35. The method of claim 34, wherein the output resistance is further adjusted based on a third resistor with the first resistance, the third resistor between the first transistor and the second terminal.

* * * * *